US012575424B2

(12) United States Patent
Pursula et al.

(10) Patent No.: US 12,575,424 B2
(45) Date of Patent: Mar. 10, 2026

(54) WAFER-LEVEL PACKAGE FOR MILLIMETRE WAVE AND THz SIGNALS

(71) Applicant: Teknologian tutkimuskeskus VTT Oy, Espoo (FI)

(72) Inventors: Pekka Pursula, Espoo (FI); Vladimir Ermolov, Espoo (FI); Antti Lamminen, Espoo (FI); Jaakko Saarilahti, Espoo (FI); Mikko Varonen, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 383 days.

(21) Appl. No.: 18/031,630

(22) PCT Filed: Oct. 8, 2021

(86) PCT No.: PCT/FI2021/050669
§ 371 (c)(1),
(2) Date: Apr. 13, 2023

(87) PCT Pub. No.: WO2022/079348
PCT Pub. Date: Apr. 21, 2022

(65) Prior Publication Data
US 2023/0387045 A1      Nov. 30, 2023

(30) Foreign Application Priority Data
Oct. 13, 2020     (FI) ...................................... 20206003

(51) Int. Cl.
*H01L 23/66*          (2006.01)
*H01L 23/00*          (2006.01)
(Continued)

(52) U.S. Cl.
CPC .......... *H01L 23/66* (2013.01); *H01L 23/3121* (2013.01); *H01L 23/49822* (2013.01);
(Continued)

(58) Field of Classification Search
CPC ................. H01L 23/66; H01L 23/3121; H01L 23/49822; H01L 23/3114; H01L 24/08;
(Continued)

(56) References Cited

U.S. PATENT DOCUMENTS 5,414,394 A * 5/1995 Gamand ................. H01P 5/107
333/34
10,109,604 B2 10/2018 Topak et al.
(Continued)

FOREIGN PATENT DOCUMENTS

WO      WO2020134331 A1      7/2020

OTHER PUBLICATIONS

Boussaha et al: 2.7 THz Balanced Waveguide HEB Mixer. IEEE Transactions on Terahertz Science and Technology, Jul. 30, 2014, vol. 4, No. 5, pp. 545-551.
(Continued)

*Primary Examiner* — Dao H Nguyen
(74) *Attorney, Agent, or Firm* — Laine IP Oy

(57)          ABSTRACT

According to an example aspect of the present invention, there is provided a wafer-level package (1), comprising a top substrate (10) and a bottom substrate (30), wherein the top substrate (10) comprises a recess (12) on a side of the top substrate (10) which is towards the bottom substrate (30) and the bottom substrate (30) comprises a recess (32) on a side of the bottom substrate (30) which is towards the top substrate (10), wherein the recess (12) of the top substrate (10) and the recess (32) of the bottom substrate (30) are arranged to form a waveguide (5) within the wafer-level package (1) and a middle substrate (20) arranged to couple an integrated circuit (24) of the wafer-level package (1) to the waveguide (5), wherein the middle substrate (20) is in between the top substrate (10) and the bottom substrate (30) and the middle substrate (20) comprises a probe (21),
(Continued)

wherein the probe (21) extends to the waveguide (5) and the probe (21) is arranged to couple a signal coming from the integrated circuit (24) to the waveguide (5), or to couple a signal coming from the waveguide (5) to the integrated circuit (24).

14 Claims, 6 Drawing Sheets

(51) Int. Cl.
H01L 23/31 (2006.01)
H01L 23/498 (2006.01)

(52) U.S. Cl.
CPC .............. *H01L 24/08* (2013.01); *H01L 24/48* (2013.01); *H01L 2223/6611* (2013.01); *H01L 2223/6627* (2013.01); *H01L 2223/6683* (2013.01); *H01L 2224/08155* (2013.01); *H01L 2224/48158* (2013.01); *H01L 2924/10253* (2013.01); *H01L 2924/1423* (2013.01); *H01L 2924/18161* (2013.01)

(58) Field of Classification Search
CPC .............. H01L 24/48; H01L 2223/6611; H01L 2223/6627; H01L 2223/6683; H01L 2224/08155; H01L 2224/48158; H01L 2924/10253; H01L 2924/1423; H01L 2924/18161; H01P 5/107
See application file for complete search history.

(56) References Cited

U.S. PATENT DOCUMENTS

| | | | | |
|---|---|---|---|---|
| 10,522,891 B2 * | 12/2019 | Drouin | ..................... | H01P 3/12 |
| 12,149,014 B2 * | 11/2024 | Li | ......................... | H01Q 9/065 |
| 2007/0229182 A1 | 10/2007 | Gaucher et al. | | |

OTHER PUBLICATIONS

Ermolov et al: Micromachining integration platform for sub-terahertz and terahertz systems. International Journal of Microwave and Wireless Technologies, Apr. 10, 2018, vol. 10, No. 5-6, pp. 651-659.

Hassona et al: Nongalvanic Generic Packaging Solution Demonstrated in a Fully Integrated D-Band Receiver. IEEE Transactions on Terahertz Science and Technology, Feb. 6, 2020, vol. 10, No. 3, pp. 321-330.

Jung et al: Compact Submillimeter-wave Receivers made with Semiconductor Nano-Fabrication Technologies. IEEE MTT-S International Microwave Symposium, Aug. 4, 2011, pp. 1-4.

Song: Packages for Terahertz Electronics. Proceedings of the IEEE, Jun. 1, 2017, vol. 105, No. 6, pp. 1121-1138.

* cited by examiner

1

WAFER-LEVEL PACKAGE FOR MILLIMETRE WAVE AND THz SIGNALS

FIELD

Embodiments of the present invention relate in general to electronics and more specifically to a wafer-level package for millimeter wave and THz signals and components.

BACKGROUND

In the context of electronics, a wafer refers to a very thin slice of a semiconductor material, such as silicon. Wafers may be used at least for fabrication of Integrated Circuits, ICs. In case of ICs, application of for example millimetre wave and THz technology is currently limited by the price and size of the systems. Main cost impact comes from component packaging and system integration. Manual work and use of expensive high-accuracy manufacturing that scales badly to larger manufacturing volumes should be avoided. Application needs exist anyway for example in security imaging, spectroscopy of (biological) molecules, and radiometric and radar imaging, such as space and Earth observation as well as for Advanced Driver-Assistance Systems, ADAS. Hence, there is a need for improvement to bring down the price and size of integrated systems which are used for millimeter wave and THz signals.

SUMMARY OF THE INVENTION

According to some aspects, there is provided the subject-matter of the independent claims. Some embodiments are defined in the dependent claims.

According to a first aspect of the present invention, there is provided a wafer-level package, comprising a top substrate and a bottom substrate, wherein the top substrate comprises a recess on a side of the top substrate which is towards the bottom substrate and the bottom substrate comprises a recess on a side of the bottom substrate which is towards the top substrate, wherein the recess of the top substrate and the recess of the bottom substrate are arranged to form a waveguide within the wafer-level package and a middle substrate arranged to couple an integrated circuit of the wafer-level package to the waveguide, wherein the middle substrate is in between the top substrate and the bottom substrate and the middle substrate comprises a probe, wherein the probe extends to the waveguide and the probe is arranged to couple a signal coming from the integrated circuit to the waveguide, or to couple a signal coming from the waveguide to the integrated circuit.

Embodiments of the first aspect may comprise at least one feature from the following bulleted list:

- the waveguide is metal-walled;
- a top of the probe has metal patterning and a bottom of the probe is without metal covering, said metal preferably being gold;
- the middle substrate further comprises a feed line arranged to couple the integrated circuit to the probe. The middle substrate may further comprise a ground plane below the feed line. The middle substrate may further comprise a trench, wherein the trench surrounds the feed line and the trench is arranged to reduce losses of the feed line and to provide a connection to the ground plane;
- the middle substrate comprises a flip-chip connection area, the flip-chip connection area further comprising at least two pads to interconnect the integrated circuit to the middle substrate using flip-chip bonding. The middle substrate may further comprise a trench around the flip-chip connection area to reduce flip-chip losses;
- the middle substrate further comprises a cavity and the cavity is arranged such that the integrated circuit can be placed to the cavity for a face up connection and ribbon or wire bonding;
- the wafer-level package further comprises a trench, wherein the trench is arranged to go around the waveguide on a horizontal plane and the trench goes through the middle substrate in a vertical direction to form a continuous galvanic connection between the top substrate, the middle substrate and the bottom substrate;
- the top substrate comprises an opening for wiring, wherein the opening is arranged to go through the top substrate so that wires can be placed to the opening;
- the top substrate comprises a pocket for electronics, wherein the pocket is arranged such that the integrated circuit can be placed to the pocket.

EMBODIMENTS

Embodiments of the present invention relate to a multi-layer wafer-level package for millimetre wave and THz components and systems. According to the embodiments of the present invention, the wafer-level package comprises a middle substrate in between a top substrate and a bottom substrate. The substrates of the wafer-level package are arranged such that a waveguide is formed within the wafer-level package. The wafer-level package also comprises an integrated circuit and the middle substrate comprises a probe extending to the waveguide to provide a connection between the integrated circuit and the waveguide, i.e., to enable transitions between the integrated circuit and the waveguide. The use of such a middle substrate enables working on wafer level through the fabrication process of the wafer-level package while reducing manual work in the placement of the integrated circuit.

Figure 1:
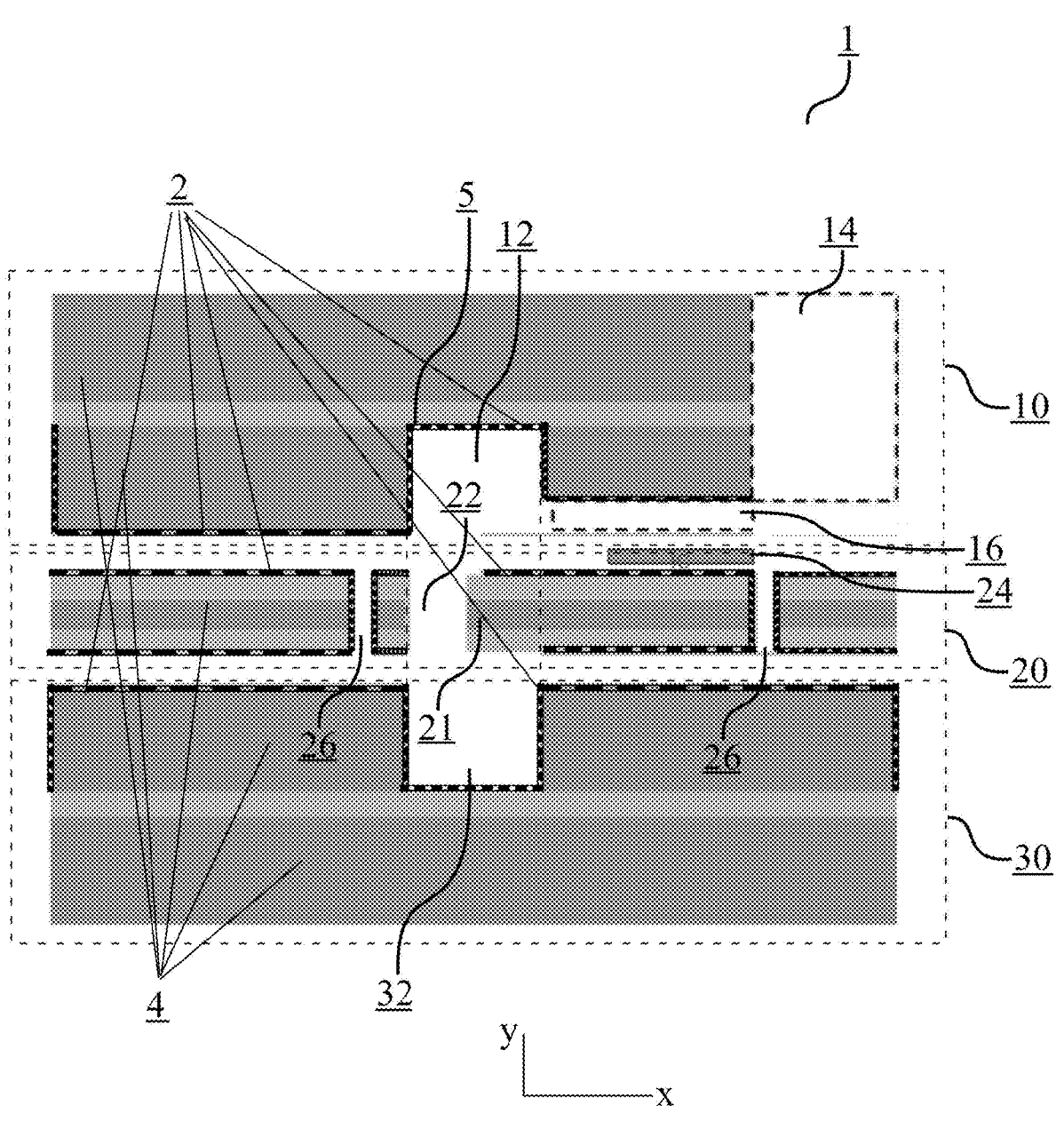
FIG. 1 illustrates a first example of a wafer-level package in accordance with at least some embodiments of the present invention.

FIG. 1 illustrates a first example of a wafer-level package in accordance with at least some embodiments of the present invention. More specifically, FIG. 1 illustrates an example of a multi-layer wafer-level package 1, wherein metal, such as gold, is denoted by 2 and wafer material, such as silicon, is denoted by 4.

As shown in FIG. 1, the wafer-level package 1 comprises a top wafer 10, a middle wafer 20 and a bottom wafer 30. The middle wafer is in between the top wafer 10 and the bottom wafer 30. In some embodiments, there may be more than one middle wafer 20. The middle wafer 20 may be referred to as a probe layer as well, because the middle wafer 20 comprises a probe 21. The probe 21 extends to a waveguide 5 and the probe 21 is arranged to couple a signal coming from an integrated circuit 24 to the waveguide 5. The probe 21 is a part of the middle wafer extending into the waveguide 5. In the example of FIG. 1, the middle wafer 20 is arranged to couple the integrated circuit 24 of the wafer-level package 1 to the waveguide 5 within the wafer-level package 1 by using flip-chip bonding technique.

The wafers may comprise one, two or several package areas so that, after bonding the wafers together, one, two or several separate wafer-level packages can be diced out of the structure, if desired. Alternatively, the wafers may form one package or a structure comprising more than one package in one structure. In any case, the wafer-level package comprises a top substrate originating from a top wafer 10, a middle substrate originating from the middle wafer 20 and a bottom substrate originating from the bottom wafer 30. The term substrate thus refers to a whole wafer or a portion of the wafer that has been diced from the wafer. That is to say, in embodiments of the present invention the top wafer 10 may refer to the top substrate 10, the middle wafer 20 may refer to the middle substrate 20 and the bottom wafer 30 may refer to the bottom substrate 30.

The top wafer 10 comprises a recess 12. The recess 12 is on a side of the top wafer 10, wherein said side of the top wafer 10 is towards the middle wafer 20 and the bottom wafer 30. The recess 12 is arranged to form a part of the waveguide 5. The recess 12 may be metal-walled to form a part of the metal-walled waveguide 5. At least said side of the recess 12 of the top wafer 10 may be thus covered by metal, such as gold. At least said side of the top wafer 10 which is towards the middle wafer 20 may be covered with said metal to ensure a galvanic contact between the top wafer 10 and the middle wafer 20, i.e., to ensure good electrical contact.

The top wafer 10 may further comprise an opening 14 for wiring and/or a pocket 16 for electronics. The opening 14 is arranged to go through the top wafer 10 such that wires can be placed to the opening 14. The opening 14 enables a connection to the outside of the wafer-level package 1. The opening 14 may be for I/O connections so that there may be for example pads for soldering external DC wires, etc.

The pocket 16 may be on said side of the top wafer 10 which is towards the middle wafer 20. The pocket 16 is arranged such that the integrated circuit can be placed into the pocket when the integrated circuit 24 is attached on top of the middle wafer 20. The pocket 16 is for the integrated circuit 24 so that the integrated circuit 24 can be flip-chipped or wire-bonded to inside of the wafer-level package 1.

The middle wafer 20 comprises an opening, wherein said opening has a width which correspond to a width of the full waveguide 5 in the middle wafer 20. Said opening follows the geometry of the waveguide. The vertical walls of the opening may be covered with metal. At least parts of the top and bottom sides of the middle wafer 20 may be covered with said metal, such as gold, to form a galvanic contact between the wafers. The opening is smaller at a point 22 of the waveguide 5, because the probe 21 extends to the waveguide 5 at the point 22. At the point 22, one side of the probe 21 may be covered with metal patterning while another side of the probe 21 may be without metal, i.e., not covered by metal. That is to say, the probe 21 is not fully covered by metal. The top of the probe 21 is covered by said metal patterning and a bottom of the probe 21 is without metal covering. Said metal patterning means that the probe 21 is not fully covered by metal on the top.

The probe 21 may hence extend to the waveguide 5 at point 22. That is to say, the middle wafer 20 may be arranged to enable a transition from an integrated circuit 24 to the waveguide 5 at point 22 and vice versa. The integrated circuit 24 may be a Monolithic Microwave Integrated Circuit, MMIC, and in such a case the middle wafer 20 may be arranged to enable a MMIC-to-waveguide transition. The integrated circuit 24 may also be a diode, a detector, a mixer, an amplifier, or any component that is fabricated on a separate chip. The transition between the integrated circuit 24 and the waveguide 5 may be performed on full wafer, i.e., on the middle wafer 20, and hence no manual placement of the integrated circuit 24 is required, thereby achieving lower cost, better alignment accuracy and more robust solution.

In some embodiments, the middle wafer 20 may comprise a trench 26. The trench 26 may be referred to as a groove as well, i.e., as a narrow channel or depression. The trench 26 goes around the waveguide 5 on a horizontal plane and through the middle wafer 20 in a vertical direction to form a continuous galvanic connection between the top wafer 10, the middle wafer 20 and the bottom wafer 30. In this case, the vertical walls of the trench 26 are covered with metal, but the opening (that forms the waveguide) in the middle wafer 20 does not have metal on vertical walls. The expression "vertical" means a direction which is perpendicular to a bottom plane of the wafer-level package 1. The expression "horizontal" refers to a direction which is identical with the bottom plane of the wafer-level package 1. The horizontal direction is denoted by x in FIG. 1 while y denotes the vertical direction. The trench 26 may also be arranged to form metallic sidewalls of the waveguide 5 in the middle wafer 20.

The bottom wafer 30 comprises a recess 32. The recess 32 is on a side of the bottom wafer 30, wherein said side of the bottom wafer 30 is towards the top wafer 10 and the middle wafer 20. The recess 32 is arranged to form a part of the waveguide 5. Thus, the recess 12 of the top wafer 10 and the recess 32 of the bottom wafer 30 are arranged to form the waveguide 5. That is to say, the recess 12 of the top wafer 10, the point 22 of the middle wafer 20 and the recess 32 of the bottom wafer 30 are aligned such that the rectangular waveguide 5 is formed. At least said side of the bottom wafer 30 which is towards the middle wafer 20 may be covered with metal, such as gold, to enable electrical contact between all the wafers 10, 20 and 30.

Figure 2:
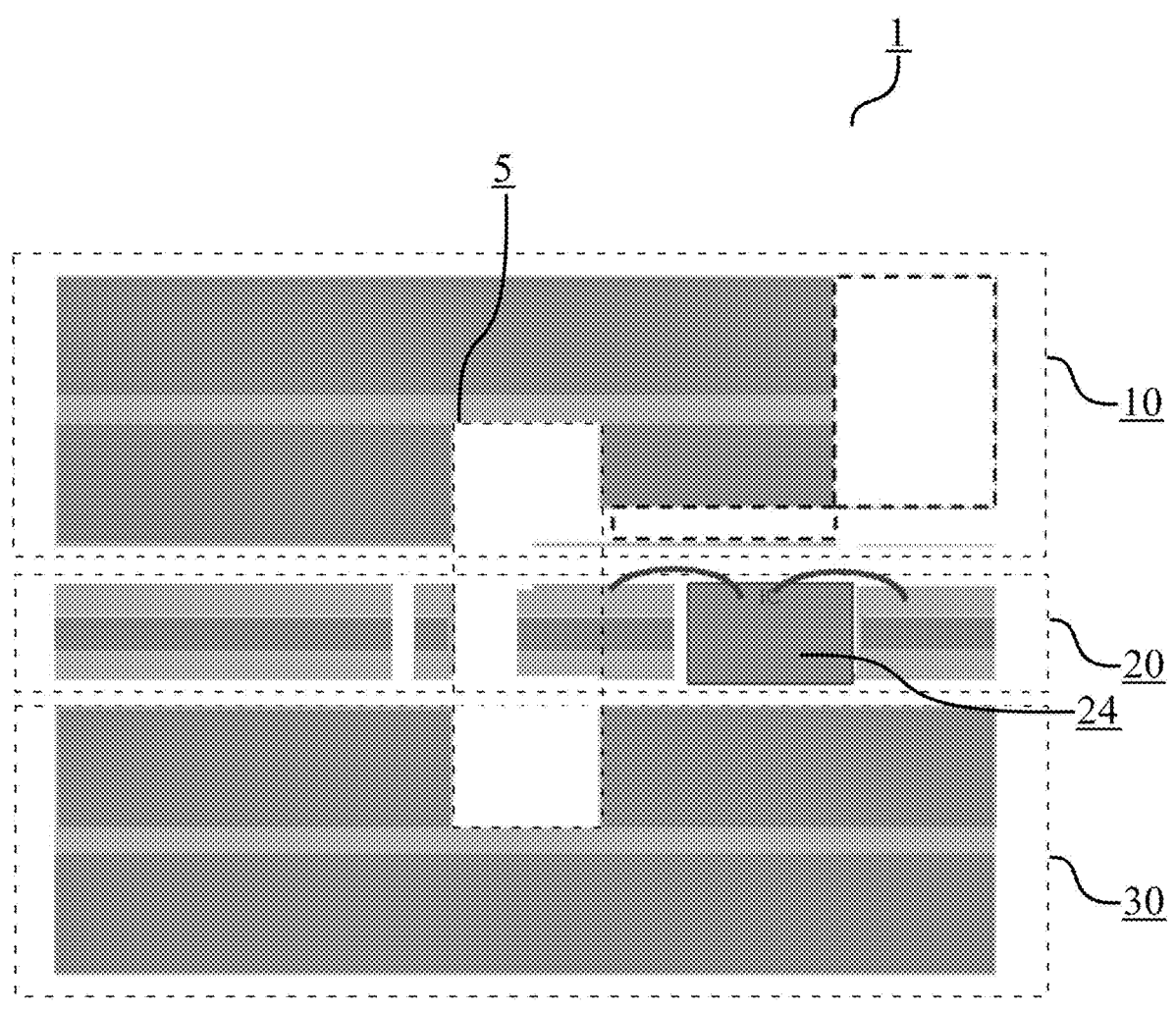
FIG. 2 illustrates a second example of a wafer-level package in accordance with at least some embodiments of the present invention.

FIG. 2 illustrates a second example of a wafer-level package in accordance with at least some embodiments of the present invention. More specifically, FIG. 2 illustrates an example of a multi-layer wafer-level package 1, wherein ribbon or wire bonding is used. The wafer-level package 1 shown in FIG. 2 may be the same as the wafer-level package 1 shown in FIG. 1 otherwise, but the location and attachment means of the integrated circuit 24 are different. In case of the example of FIG. 2, the middle wafer 20 may comprise a cavity for the integrated circuit 24. In some cases, the cavity may extend to the bottom wafer 30. The cavity may be done using a trench process step. The cavity goes through the middle wafer 20 and is arranged such that the integrated circuit 24 can be placed to the middle wafer 20. That is to say, the cavity is arranged such that the integrated circuit 24 can be inserted to the middle wafer 20. The integrated circuit 24 may be therefore attached to the middle wafer 20 using ribbon or wire bonding. The cavity may be fabricated in the middle wafer 20 for a face up connection.

Figure 3:
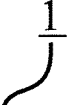
FIG. 3 illustrates a third example of a wafer-level package in accordance with at least some embodiments of the present invention.
Figure 3:
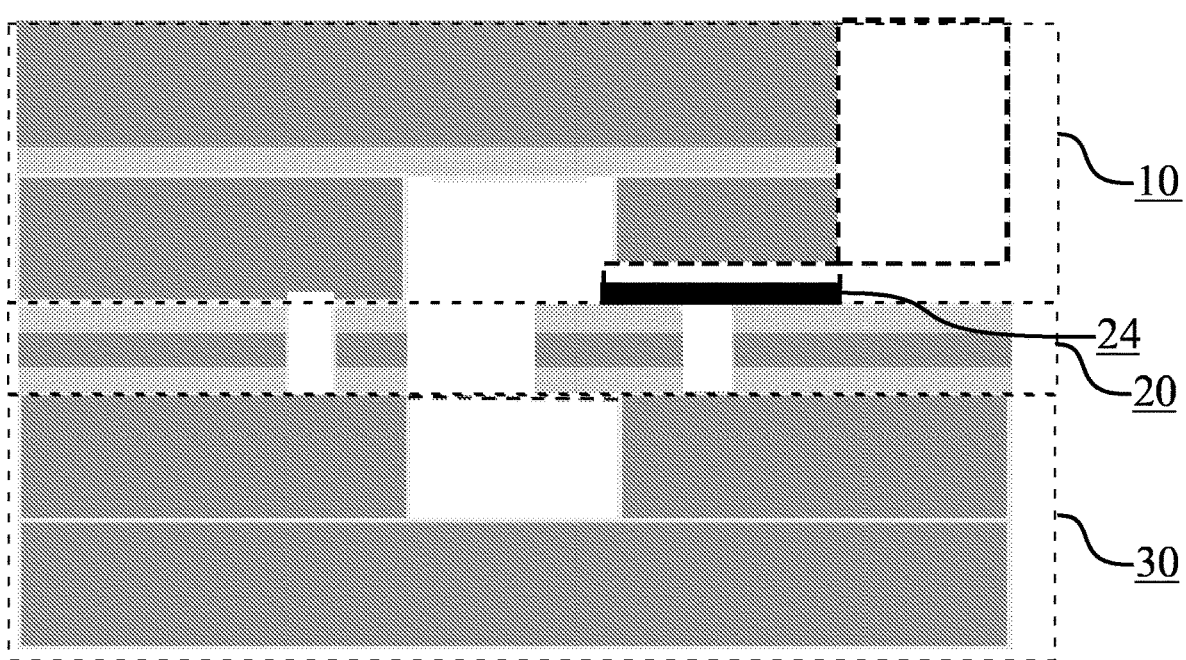

FIG. 3 illustrates a third example of a wafer-level package in accordance with at least some embodiments of the present invention. More specifically, FIG. 3 illustrates an example of a multi-layer wafer-level package 1, wherein the top wafer 10, the middle wafer 20 and the bottom wafer 30 have been bonded together to form the wafer-level package 1. That is to say, FIG. 3 illustrates the closed wafer-level package 1.

Figure 4:
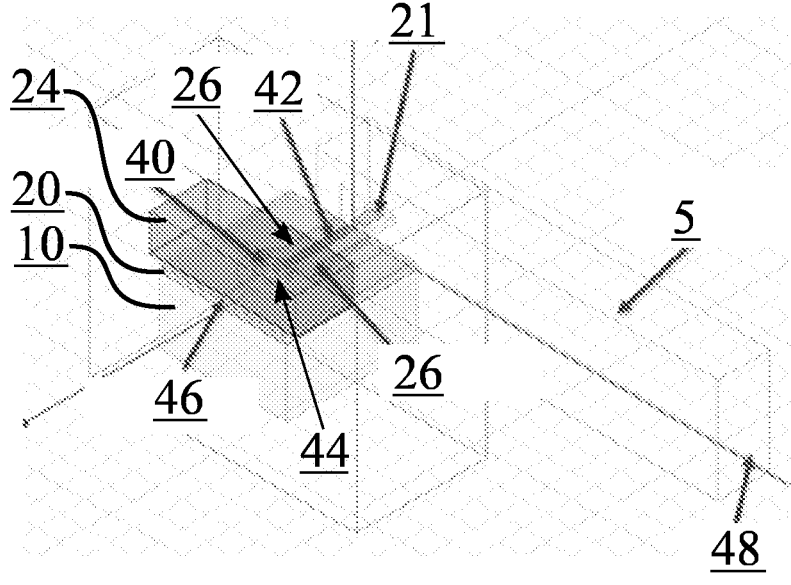
FIG. 4 illustrates an example of a wafer-level package in 3-dimensions in accordance with at least some embodiments of the present invention.

FIG. 4 illustrates an example of a wafer-level package in 3-dimensions in accordance with at least some embodiments of the present invention. The middle wafer 20 shown in FIG. 4 comprises pads 40, such as Ground-Signal-Ground, GSG, pads, for the flip-chip connection. The pads 40 are arranged to interconnect the integrated circuit 24 to the middle wafer 20 so that the integrated circuit 24 can be attached to the top of the middle wafer 20.

As shown in the example of FIG. 1, the integrated circuit 24 may be on top of the middle wafer 20 and the integrated circuit 24 may be attached to the middle wafer using flip-chip bonding. The middle wafer 20 may be arranged to enable flip-chip bonding of the integrated circuit 24 to a flat surface of the middle wafer 20 by using the pads thereby making the solution mass-producible. Moreover, flip-chip bonding removes manual working steps, such as wire bonding and beam lead attachment which are typically used for connecting integrated circuits to waveguides, thereby making the solution cost-efficient.

For instance, if the transition between the integrated circuit 24 and the waveguide 5 would be performed on a separate chip, such a solution would require manual positioning and manual wire bonding. Also a ground connection to a probe may be hard to achieve. These challenges would lead to high cost of labor and high variances in final performance.

If the transition between the integrated circuit 24 and the waveguide 5 would be performed on the integrated circuit 24, an expensive area of a chip comprising the integrated circuit 24 would be increased. Also, a substrate of the integrated circuit 24 is typically lossy and a radiative connection element, such as a probe, on the integrated circuit chip would lead to high-loss transition between the integrated circuit 24 and the waveguide 5.

In addition, the middle wafer 20 shown in FIG. 4 comprises a feed line 42. The middle wafer 20 is a thin layer under the integrated circuit 24. The feed line 42 may be on top of the middle wafer 20. The feed line 42 couples the integrated circuit 24 to the probe 21. The probe 21 extends to the waveguide 5 as shown in FIG. 4.

The integrated circuit 24 comprises a port (port 1) 46 on chip and the middle wafer 20 comprises the trench 26 e.g., on silicon. The trench 26 surrounds the feed line 42 on the middle wafer 20 and the trench 26 goes around a flip-chip connection area 44, wherein the flip-chip connection area 44 comprises the pads 40. In some embodiments, the waveguide 5 may be a vertical waveguide. That is to say, the waveguide is higher in vertical direction but waveguides travel in the direction of the wafer surface, i.e., are horizontal in that sense. A waveguide port (port 2) is denoted by 48 in FIG. 4. The trench 26 is arranged to reduce losses of the feed line 42 and to provide a connection to a ground plane. Thus, losses may be minimized by using the trench 26 around the feed line 42. The trench 26 is metal-plated. The trench 26 may go through the full middle wafer 20, providing good electrical contact between the wafers 10, 20 and 30.

Figure 5A:
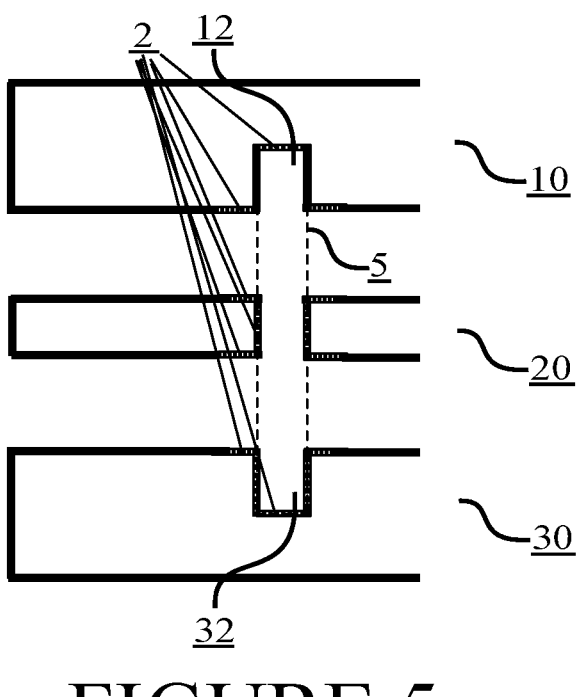
FIG. 5a illustrates a cross-section of an embodiment without a trench.

FIG. 5a illustrates a cross-section of an embodiment without a trench. More specifically, FIG. 5 illustrates a cross-section of the wafer-level package 1 at a position outside the probe 21 position, where only the waveguide 5 is shown. As shown in FIG. 5a, the metal-walled waveguide 5 may be formed without the trench 26 if side walls of the middle wafer 20 are covered by metal at point 22, i.e., at a location of the waveguide 5. The metallization may be extended so that a portion of the bottom of the top wafer 10, portions of the top and the bottom of the middle wafer 20 and a portion of the top of the bottom wafer 30 are covered by metal, to ensure good connectivity after bonding the wafers together. The metallization may be extended in all embodiments this way. The metallization may be aligned as shown in FIG. 5a, but the metallization does not need to be precisely aligned in general, i.e., the metallization may be about in-line.

Figure 5B:
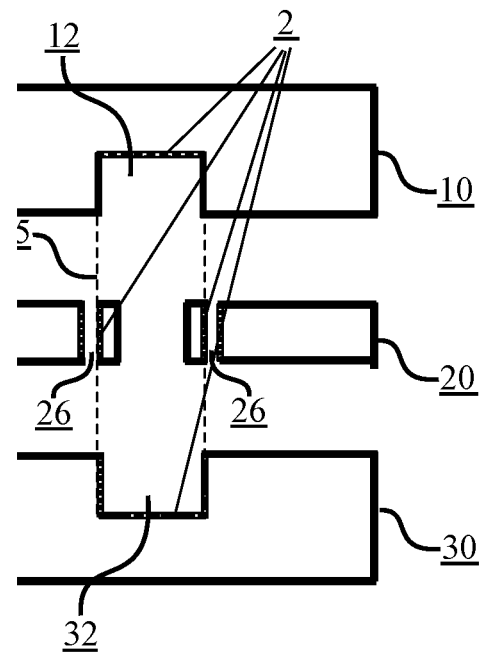
FIG. 5b illustrates a cross-section of an embodiment with a trench.

FIG. 5b illustrates a cross-section of an embodiment with a trench. Similarly as in case of FIG. 5b, the probe 21 is not shown in FIG. 5b. As shown in FIG. 5b, sides of the trench 26 may be covered by metal to form the metal-walled waveguide 5. Use of the trench 26 enables easier fabrication of the wafer-level package 1, because it is easier to cover vertical sides completely with metal compared to covering only a part of a side of the middle wafer 20 with metal for the probe 21. Moreover, for the same reason, the trench 26 may have metallization on both of the vertical sides of the trench 26, even if only one side is necessary for galvanic contact. The trenches may be positioned at the location of the vertical walls of the waveguide recesses 12 and 32 in the top and bottom wafers, as shown in FIG. 5b, or the trenches can be positioned at any distance outside the waveguide for fabrication reasons, thus widening the waveguide in the middle wafer. In this case, metal may extend to the horizontal surfaces of the top and bottom wafers (as shown in FIG. 5a) to ensure galvanic contact.

Figure 6A:
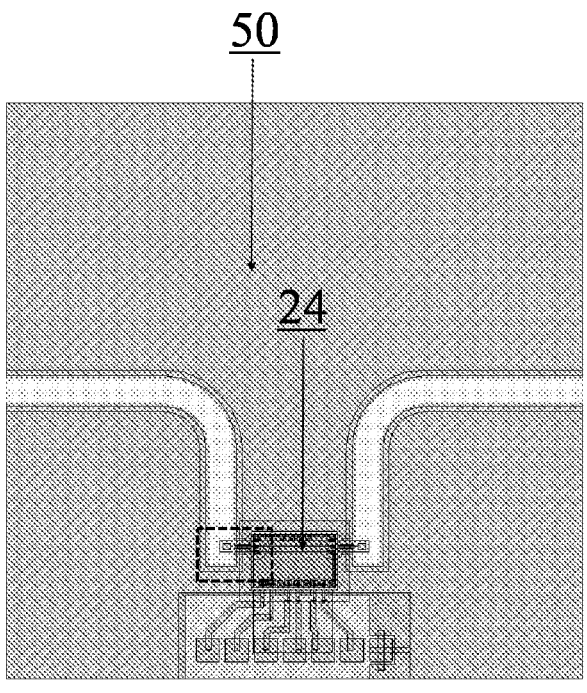
FIG. 6a illustrates a complete module in accordance with at least some embodiments of the present invention.

FIG. 6a illustrates an example of a complete module in accordance with at least some embodiments of the present invention. In FIG. 6a, a silicon package is denoted by 50 and the integrated circuit 24, such as a MIMIC, is on the silicon package 50. FIG. 6a shows input and output waveguide interfaces and the integrated circuit 24 with two probe transitions (in and out).

Figure 6B:
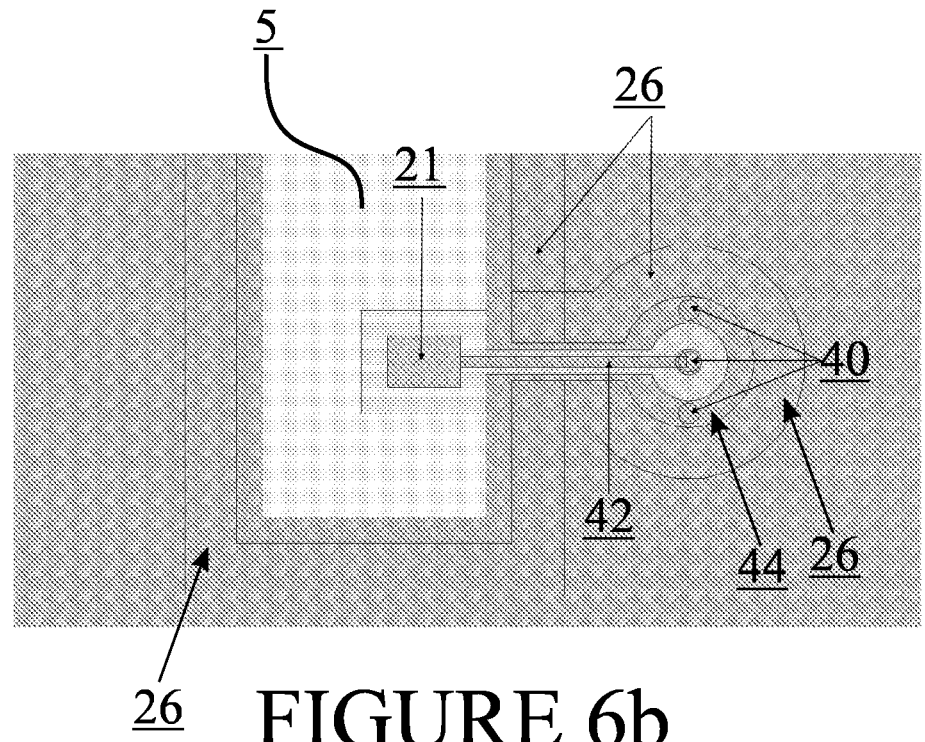
FIG. 6b illustrates an example of a probe arrangement in accordance with at least some embodiments of the present invention.

FIG. 6b illustrates an example of a probe arrangement in accordance with at least some embodiments of the present invention. FIG. 6b shows the pads 40, such as GSG bumps, the feed line 42 (preferably a Grounded Coplanar Waveguide, GCPW) and the probe 21 (such as a E-plane waveguide probe) extending to the waveguide 5. The trench 26 is also shown in FIG. 6b. The GCPW may be used for low loss reasons, to confine the signal within metallic planes and the signal cannot propagate into the lossy silicon wafers at large. In case of the GCPW, the grounding comes from the bottom ground on top of the bottom wafer. The GCPW may be an interface for the integrated circuit 24 which has GSG-type of input and outputs for on-wafer probe testing.

The feed line 42 may be coupled to the probe 21 as shown in FIG. 6b. In some embodiments, the middle wafer 20 may comprise a ground plane below the feed line 42 to minimize losses. The trench 26 may be arranged to connect the integrated circuit 24 to the ground plane below the feed line 42. It is important to note that the ground plane may not extend under the probe 21.

So in general, in accordance with embodiments of the present invention, a trench may be used in a multi-layer wafer-level package, such as the three-wafer-level package 1, to enable galvanic connection between all wafers, to prevent higher order modes inside silicon substrate and to provide a proper ground connection for the integrated circuit 24 which is flip-chip bonded. A trench process step may also be used to make a chip cavity in the middle wafer 20 for wire bonding (FIG. 2). The cavity may be used to minimize the length, i.e., the parasitic inductance of the bond wires.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths and widths as electrical dimensions (i.e., as a function of a used wavelength), shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in security imaging, spectroscopy, and radiometric and radar imaging.

ACRONYMS LIST

ADAS Advanced Driver-Assistance Systems
GCPW Grounded Coplanar Waveguide
GSG Ground-Signal-Ground
MMIC Monolithic Microwave Integrated Circuit

REFERENCE SIGNS LIST

| | |
|---|---|
| 1 | Wafer-level package |
| 2 | Oxidation layer |
| 4 | Wafer material |
| 5 | Waveguide |
| 10 | Top wafer, i.e., top substrate |
| 12, 32 | Recesses |
| 14 | Opening for wiring |
| 16 | Pocket for electronics |
| 20 | Middle wafer, i.e., middle substrate |
| 21 | Probe |
| 22 | Point in the middle wafer 20 |
| 24 | Integrated circuit |
| 26 | Trench |
| 30 | Bottom wafer, i.e., bottom substrate |
| 40 | Pads |
| 42 | Feed line |
| 44 | Flip-chip connection area |
| 46 | MS port on chip |
| 48 | WR-3 port |
| 50 | Silicon package |

The invention claimed is:

1. A wafer-level package, comprising:
a top substrate and a bottom substrate, wherein the top substrate comprises a recess on a side of the top substrate which is towards the bottom substrate and the bottom substrate comprises a recess on a side of the bottom substrate which is towards the top substrate, and wherein the recess of the top substrate and the recess of the bottom substrate are arranged to form a waveguide within the wafer-level package;
a middle substrate arranged to couple an integrated circuit of the wafer-level package to the waveguide, wherein the middle substrate is in between the top substrate and the bottom substrate and the middle substrate comprises a probe, and wherein the probe extends to the waveguide and the probe is arranged to couple a signal coming from the integrated circuit to the waveguide, or to couple a signal coming from the waveguide to the integrated circuit; and
a trench, wherein the trench is arranged to go around the waveguide on a horizontal plane and the trench goes through the middle substrate in a vertical direction to form a continuous galvanic connection between the top substrate, the middle substrate and the bottom substrate.

2. The wafer-level package according to claim 1, wherein the waveguide is metal-walled.

3. The wafer-level package according to claim 1, wherein a top of the probe has metal patterning and a bottom of the probe is without metal covering.

4. The wafer-level package according to claim 3, wherein the metal of the metal patterning comprises gold.

5. The wafer-level package according to claim 1, wherein the middle substrate further comprises a feed line arranged to couple the integrated circuit to the probe.

6. The wafer-level package according to claim 5, wherein the middle substrate further comprises a ground plane below the feed line.

7. The wafer-level package according to claim 6, wherein the middle substrate further comprises a trench, wherein the trench surrounds the feed line and the trench is arranged to reduce losses of the feed line and to provide a connection to the ground plane.

8. The wafer-level package according to claim 1, wherein the middle substrate comprises a flip-chip connection area, the flip-chip connection area further comprising at least two pads to interconnect the integrated circuit to the middle substrate using flip-chip bonding.

9. The wafer-level package according to claim 8, wherein the middle substrate further comprises a trench around the flip-chip connection area to reduce flip-chip losses.

10. The wafer-level package according to claim 1, wherein the middle substrate further comprises a cavity and the cavity is arranged such that the integrated circuit can be placed to the cavity for a face up connection and ribbon or wire bonding.

11. The wafer-level package according to claim 1, wherein the top substrate comprises an opening for wiring, and wherein the opening is arranged to go through the top substrate so that wires can be placed to the opening.

12. The wafer-level package according to claim 1, wherein the top substrate comprises a pocket for electronics, and wherein the pocket is arranged such that the integrated circuit can be placed into the pocket.

13. A wafer-level package, comprising:

a top substrate and a bottom substrate, wherein the top substrate comprises a recess on a side of the top substrate which is towards the bottom substrate and the bottom substrate comprises a recess on a side of the bottom substrate which is towards the top substrate, and wherein the recess of the top substrate and the recess of the bottom substrate are arranged to form a waveguide within the wafer-level package; and a middle substrate arranged to couple an integrated circuit of the wafer-level package to the waveguide, wherein the middle substrate is in between the top substrate and the bottom substrate and the middle substrate comprises a probe, and wherein the probe extends to the waveguide and the probe is arranged to couple a signal coming from the integrated circuit to the waveguide, or to couple a signal coming from the waveguide to the integrated circuit;

wherein the middle substrate further comprises a cavity and the cavity is arranged such that the integrated circuit can be placed to the cavity for a face up connection and ribbon or wire bonding.

14. A wafer-level package, comprising:

a top substrate and a bottom substrate, wherein the top substrate comprises a recess on a side of the top substrate which is towards the bottom substrate and the bottom substrate comprises a recess on a side of the bottom substrate which is towards the top substrate, and wherein the recess of the top substrate and the recess of the bottom substrate are arranged to form a waveguide within the wafer-level package; and a middle substrate arranged to couple an integrated circuit of the wafer-level package to the waveguide, wherein the middle substrate is in between the top substrate and the bottom substrate and the middle substrate comprises a probe, wherein a top of the probe has metal patterning and a bottom of the probe is without metal covering, and wherein the probe extends to the waveguide and the probe is arranged to couple a signal coming from the integrated circuit to the waveguide, or to couple a signal coming from the waveguide to the integrated circuit.

* * * * *